(12) United States Patent
Kurihara et al.

(10) Patent No.: US 6,381,163 B1
(45) Date of Patent: Apr. 30, 2002

(54) METHODS AND APPARATUS FOR READING A CAM CELL USING BOOSTED AND REGULATED GATE VOLTAGE

(75) Inventors: Kazuhiro Kurihara, Sunnyvale; Shane Hollmer, San Jose, both of CA (US)

(73) Assignees: Advanced Micro Devices, Inc., Sunnyvale, CA (US); Fujitsu Limited, Kanagawa (JP)

( * ) Notice: Subject to any disclaimer, the term of this patent is extended or adjusted under 35 U.S.C. 154(b) by 0 days.

(21) Appl. No.: 09/873,927

(22) Filed: Jun. 4, 2001

(51) Int. Cl.[7] .............................. G11C 15/00
(52) U.S. Cl. .................... 365/49; 365/189.11
(58) Field of Search .............. 365/49, 189.11

(56) References Cited

U.S. PATENT DOCUMENTS

| | | |
|---|---|---|
| 5,774,396 A | 6/1998 | Lee et al. |
| 5,966,603 A | 10/1999 | Eitan |
| 6,094,368 A | 7/2000 | Ching |
| 6,125,055 A | 9/2000 | Kasa et al. |
| 6,181,591 B1 * | 1/2001 | Miyatake et al. ............. 365/49 |

* cited by examiner

Primary Examiner—Huan Hoang
(74) Attorney, Agent, or Firm—Eschweiler & Associates, LLC

(57) ABSTRACT

A memory device with a CAM cell and a read circuit are disclosed for reading a CAM cell using a boosted CAM gate voltage. The CAM read circuit comprises a voltage booster connected between the gate terminal of the CAM cell and a supply voltage, which provides a boosted voltage to the gate terminal of the CAM cell during a CAM read operation. Also disclosed is a method for reading a memory device CAM cell, wherein a boosted voltage is provided to the CAM cell gate.

20 Claims, 5 Drawing Sheets

US 6,381,163 B1

METHODS AND APPARATUS FOR READING A CAM CELL USING BOOSTED AND REGULATED GATE VOLTAGE

FIELD OF THE INVENTION

The present invention generally relates to integrated circuits, and more particularly to apparatus and methods for boosting CAM gate voltages in reading a CAM cell.

BACKGROUND OF THE INVENTION

Flash and other types of electronic memory devices are constructed of thousands or millions of memory cells, adapted to individually store and provide access to data. A typical data cell stores a single piece of binary information referred to as a bit having one of two possible states. The memory data cells are commonly organized into multiple cell units such as bytes which comprise eight cells, and words which may include sixteen or more such cells, usually configured in multiples of eight. Storage of data in such memory device architectures is performed by writing to a particular set of memory cells, sometimes referred to as programming the cells. Retrieval of data from the cells is accomplished in a read operation. In addition to programming and read operations, groups of cells in a memory device may be erased, wherein each cell in the group is programmed to a known state.

The individual data cells are organized into individually addressable units or groups such as bytes or words, which are accessed for read, program, or erase operations through address decoding circuitry, whereby such operations may be performed on the data cells within a specific byte or word. The individual memory cells typically comprise a semiconductor structure adapted for storing a bit of data. For instance, many conventional memory cells include a metal oxide semiconductor (MOS) device, such as a transistor in which a binary piece of information may be retained. The memory device includes appropriate decoding and group selection circuitry to address such bytes or words, as well as circuitry to provide voltages to the cells being operated on in order to achieve the desired operation.

In addition to data storage cells, other peripheral information related to the memory device may be stored in one or more content addressable memory (CAM) devices. For instance, CAM devices may be provided in a memory device for storing information relating to write protection, redundancy, addressing, and/or decoding, wherein such information may be used internally for various operations. In this regard, the CAM devices may be configured as individual cells for storing one or more bits of such information, and/or in CAM arrays. In one example, a CAM cell may be used to indicate that a sector of data memory cells is defective, whereby a redundancy scheme within the memory device may alternatively employ a redundant sector for storage and retrieval of user data. Another exemplary usage of a CAM device involves storing a bit in a CAM cell indicating whether or not such redundancy is enabled.

Like the data memory cells, CAM cells are comprised of semiconductor devices, such as MOS transistors having gate, drain, and source terminals. The programming, erasing, and reading of such CAM cells are commonly performed by application of appropriate voltages to certain terminals of the CAM cell MOS device. In a CAM erase or program operation, the voltages are applied so as to cause a charge to be stored in or removed from the memory cell. In reading the CAM cell, appropriate voltages are applied so as to cause a current to flow in the CAM cell, wherein the amount of such CAM cell current is indicative of the value of the data stored therein. The associated CAM read circuitry includes appropriate circuitry to sense the resulting CAM cell current in order to determine the data stored therein.

Flash memory is a type of electronic memory media which can be rewritten and hold its content without power. Flash memory devices generally have life spans from 100K to 1MEG write cycles. Unlike dynamic random access memory (DRAM) and static random access memory (SRAM) memory chips, in which a single byte can be erased, flash memory is typically erased and written in fixed multi-bit blocks or sectors. Conventional flash memories are constructed in a cell structure wherein a single bit of information is stored in each flash memory cell. In such single bit memory architectures, the data cells and CAM cells typically include a MOS transistor structure having a source, a drain, and a channel in a substrate or P-well, as well as a stacked gate structure overlying the channel. The stacked gate may further include a thin gate dielectric layer (sometimes referred to as a tunnel oxide) formed on the surface of the P-well. The stacked gate also includes a polysilicon floating gate overlying the tunnel oxide and an interpoly dielectric layer overlying the floating gate. The interpoly dielectric layer is often a multilayer insulator such as an oxide-nitride-oxide (ONO) layer having two oxide layers sandwiching a nitride layer. Lastly, a polysilicon control gate overlies the interpoly dielectric layer.

Such a single bit stacked gate flash memory CAM cell is programmed by applying a relatively high voltage to the control gate and connecting the source to ground and the drain to a predetermined potential above the source. A resulting high electric field across the tunnel oxide leads to a phenomena called "Fowler-Nordheim" tunneling. During this process, electrons in the CAM cell channel region tunnel through the gate oxide into the floating gate and become trapped in the floating gate since the floating gate is surrounded by the interpoly dielectric and the tunnel oxide. As a result of the trapped electrons, the threshold voltage of the cell increases. This change in the threshold voltage (and thereby the channel conductance) of the CAM cell created by the trapped electrons is what causes the cell to be programmed.

In order to erase a typical single bit stacked gate flash memory CAM cell, a relatively high voltage is applied to the source, and the control gate is held at a negative potential, while the drain is allowed to float. Under these conditions, a strong electric field is developed across the tunnel oxide between the floating gate and the source. The electrons that are trapped in the floating gate flow toward and cluster at the portion of the floating gate overlying the source region and are extracted from the floating gate and into the source region by way of Fowler-Nordheim tunneling through the tunnel oxide. As the electrons are removed from the floating gate, the cell is erased.

For a conventional CAM read operation, a certain voltage bias is applied across the drain and source of the cell transistor. The voltage at the drain in conventional stacked gate CAM cells is typically provided at between about 0.5 and 1.0 volts in a read operation. A voltage between approximately 0.5 and 2.0 volts is then applied to the CAM cell gate terminal in order to cause a current to flow from the drain to source. The read operation gate voltage is typically applied at a level between a programmed cell threshold voltage ($V_T$) and an unprogrammed cell threshold voltage, wherein the erased cell threshold voltage is approximately 0.5 volts and the programmed cell threshold voltage is around 2.0 volts.

The resulting current is measured, by which a determination is made as to the data value stored in the CAM cell.

More recently, dual bit CAM cells have been introduced, which allow the storage of one or two bits of information in a single memory CAM cell. However, the gate voltage required to read dual bit CAM cells is typically higher than that of single bit, stacked gate architecture CAM cells, due to the physical construction of the dual bit cell. For example, some dual bit memory cell architectures require between about 2.0 and 3.5 volts at the CAM cell gate terminal in order to properly read the CAM contents. Conventional CAM read circuitry for single bit stacked gate CAM cells provide the gate voltage using a voltage divider circuit associated with a supply voltage (e.g., VCC). Because the voltage applied to the gate of such conventional CAM cells is derived from the memory device supply voltage, however, the ability to provide the higher gate voltage required to read the newer dual bit CAM cells may be impaired when the supply voltage is at or near lower rated levels (e.g., 2.7 to 3.6 volts). In addition, low power applications for memory devices, such as cellular telephones, laptop computers, and the like, may further reduce the supply voltage available.

Accordingly, there is a need for improved memory devices and CAM read circuitry which allow proper reading of dual bit architecture CAM cells, and which operate at reduced supply voltages.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, the purpose of this summary is to present some concepts of the invention in a simplified form as a prelude to the more detailed description that is presented later. The invention provides a memory device with a CAM cell and a read circuit for reading the CAM cell using a boosted CAM gate voltage. The invention finds application in association with a variety of CAM cell read techniques, including the ratio method, wherein the ratio of current through the CAM cell is compared with that of a reference transistor. Also disclosed is a method for reading a memory device CAM cell, wherein a boosted voltage is provided to the CAM cell gate.

According to one aspect of the present invention, there is provided a memory device having a CAM cell and a voltage booster providing a boosted voltage to the CAM gate during a CAM read operation. The booster provides a gate voltage independent of variations in the supply voltage, whereby reliable CAM read operation may be realized. The CAM cell may be used to indicate one or more binary values associated with conditions in the memory device, such as a redundancy enable status, write protection, and the like. The voltage booster is connected between the gate terminal of the CAM cell and a supply voltage, and provides a boosted voltage to the gate terminal of the CAM cell during the CAM read operation, wherein the boosted voltage is greater than an erased CAM cell threshold voltage and less than a programmed CAM cell threshold voltage.

Another aspect of the invention provides a method of reading a CAM cell associated with a memory device. The methodology comprises providing a drain read voltage to a drain terminal of the CAM cell, providing a source voltage to a source terminal of the CAM cell, and providing a boosted voltage to a gate terminal of the CAM cell. The resulting CAM cell current may then be measured in order to determine the data stored in the CAM cell.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

Detailed Description of the Invention

Figure 1:
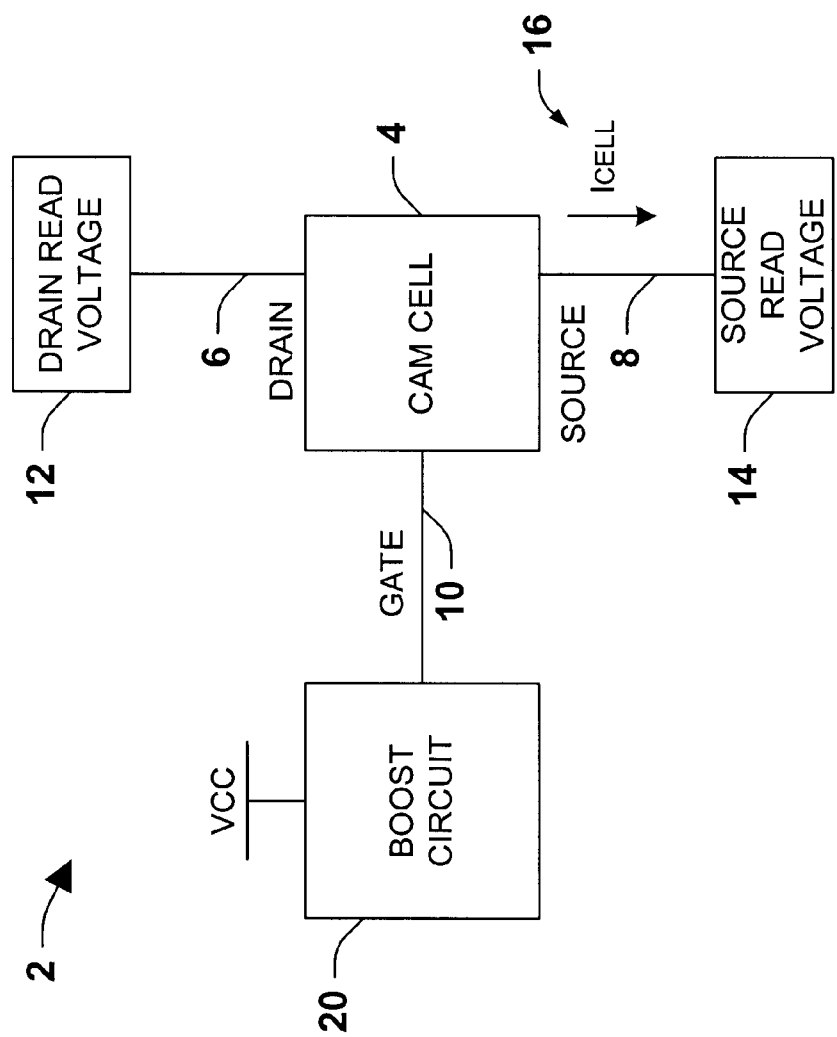
FIG. 1 is a schematic illustration of an exemplary CAM cell read circuit having a booster apparatus for providing a boosted voltage to the CAM cell gate in accordance with an aspect of the present invention.

The present invention will now be described with reference to the drawings, wherein like reference numerals are used to refer to like elements throughout. The invention provides methods and apparatus for reading CAM cells in a memory device which provides for reliable CAM reading despite reduced supply voltages common in modern memory device applications.

Referring initially to FIG. 1, a portion of an exemplary memory device 2 is illustrated having a content addressable memory (CAM) cell 4 adapted to store a binary value associated with a condition in the memory device 2. In addition to the CAM cell 4, the device 2 may comprise addressable data memory cells (not shown) for storage and retrieval of data, whereby the device 2 may be employed in a user system. The CAM cell 4 may include a semiconductor device, such as a metal oxide semiconductor (MOS) type transistor, which may store one or more bits of binary data, which may be employed internally to indicate write protection, redundancy, addressing, and/or decoding, wherein such information may be used internally for various operations. For instance, the data stored in the exemplary CAM cell 4 may indicate whether redundancy is enabled in the memory device 2.

The CAM cell 4 comprises a drain terminal 6, a source terminal 8, and a gate terminal 10, wherein appropriate voltages may be applied to the terminals 6, 8, and 10, in order to read, program, and/or erase the contents of the cell 4. In reading the CAM cell 4, appropriate drain and source voltages 12 and 14 are applied to the drain and source terminals 6 and 8, respectively, so as to cause a current 16 to flow in the CAM cell 4 when an appropriate gate voltage is applied at the gate terminal 10. The amount of the resulting CAM cell current 16 is indicative of the value of the data stored in the cell 4. In this regard, the voltage applied to the gate terminal 10 is between a programmed cell threshold voltage (VT) and an erased cell threshold voltage for the CAM cell 4.

CAM cell read circuitry (not shown) senses the resulting CAM cell current 16 in order to determine the data stored therein. Thus, where the CAM cell 4 is erased (e.g., the binary data therein is "1"), a relatively large CAM cell current 16 will flow during a CAM read operation, and where the cell 4 is programmed (e.g., the CAM cell data is binary "0"), a relatively small current 16 flows (e.g., corresponding to a leakage current). Thus, the measured cell current 16 may be compared to a threshold value (not shown) between the expected programmed and erased cell current values for the CAM cell structure, and a determination may be made as to the value of the data in the CAM cell 4.

In conventional CAM circuits, the cell 4 was fashioned using a single bit, stacked gate architecture, typically having a programmed cell VT of approximately 2.0 volts, and an erased cell VT of approximately 0.5 volts. Because prior memory devices were commonly operated using a supply voltage (VCC) of around 5.0 volts DC, the gate voltage for reading a CAM cell was typically produced by dividing down VCC using an ordinary voltage divider circuit. However, many recent low power applications require memory devices, such as FLASH memories, to be operated at lower supply voltages. For instance, modem memory devices are commonly operated with supply voltages between approximately 2.7 and 3.6 volts or less. Furthermore, since many portable applications employ batteries as their supply source, the supply voltage may further decrease while in use. Thus, the prior techniques for generating CAM cell read gate voltages may not be adequate to ensure proper read operations where the supply voltage leaves insufficient headroom to supply the proper gate voltage. In addition, the recent introduction of dual bit memory structures, having programmed and erased cell threshold voltages of approximately 3.5 and 2.0 volts, respectively, renders the prior gate voltage generation techniques (e.g., voltage dividers) less than desirable or inoperative.

The present invention provides for generating a CAM cell read voltage at the gate terminal 10 which generally is independent of variations in the supply voltage VCC, and which ensures the appropriate levels for proper reading of dual bit type CAM cells 4, as well as other type cells. According to one aspect of the invention, a voltage booster 20 is provided in the memory device 2, which is connected between the gate terminal 10 of the CAM cell 4 and the supply voltage VCC. The voltage booster 20 provides a boosted voltage to the gate terminal 10 during a CAM read operation, wherein the boosted voltage is greater than the erased CAM cell threshold voltage (e.g., approximately 2.0 volts for a dual bit CAM cell 4) and less than the programmed CAM cell threshold voltage (e.g., approximately 3.5 volts).

Figure 2:
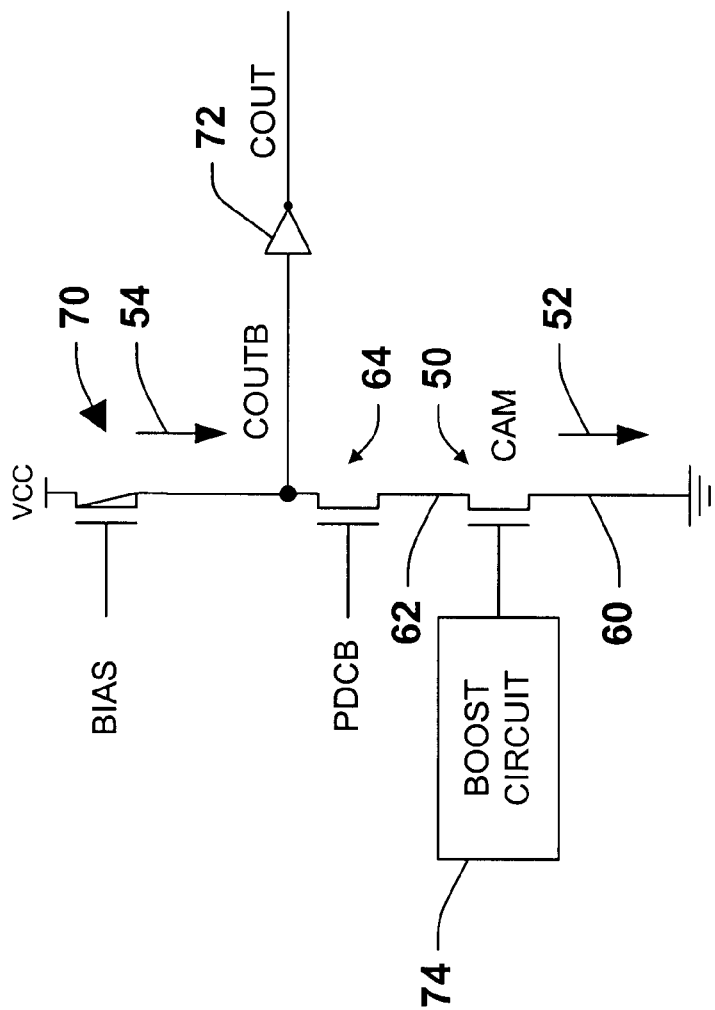
FIG. 2 is a schematic illustration of an exemplary CAM cell read circuit employing the ratio method of reading the CAM cell.

Referring briefly to FIG. 2, the information stored in a CAM cell 50 may be read using a ratio method. It will be appreciated that while one or more such CAM cells 50 may be read using the ratio technique as described below, data memory cells (e.g., core cells) in a memory device may be read using other methodologies more suited to the structural architecture of the memory data core, as may be desired. According to the ratio read technique, the cell current 52 conducting through the CAM cell 50 is compared with a current 54 through a reference transistor 70 in order to determine whether the CAM cell 50 is in a programmed state or in an erased state. A source terminal 60 of the CAM cell 50 is grounded and a drain terminal 62 thereof is connected to an NMOS transistor 64. A reference transistor 70, for example, a PMOS load transistor, is connected between the transistor 64 and the supply voltage VCC. A booster circuit 74 provides a boosted gate voltage to the CAM cell 50, according to an aspect of the invention.

The load transistor 70 is biased during a CAM read operation by a gate voltage BIAS, whereby a current 54 is established through the load transistor 70, while the N-type transistor 64 is biased by a gate voltage PDCB. A voltage at node COUTB resulting from the currents 52 and 54 is inverted by an inverter 72, and the voltage COUT is indicative of the data in the CAM cell 50. In operation, the CAM cell 50 may be programmed or erased. Where the CAM cell 50 is erased (CAM data=1), the CAM cell 50 is stronger than the load transistor 70 (e.g., a large current 52 flows through the CAM cell 50), whereby the voltage at node COUTB goes low (e.g., close to ground). This results in a high voltage at the COUT node, indicating that the CAM cell data is 1. Where the CAM cell 50 is programmed (e.g., the CAM data=0), the CAM cell 50 is weaker than the load transistor 70, and the voltage at COUTB is high (e.g., close to VCC). The resulting low voltage at the node COUT indicates that the data in the CAM cell 50 is 0.

Figure 3:
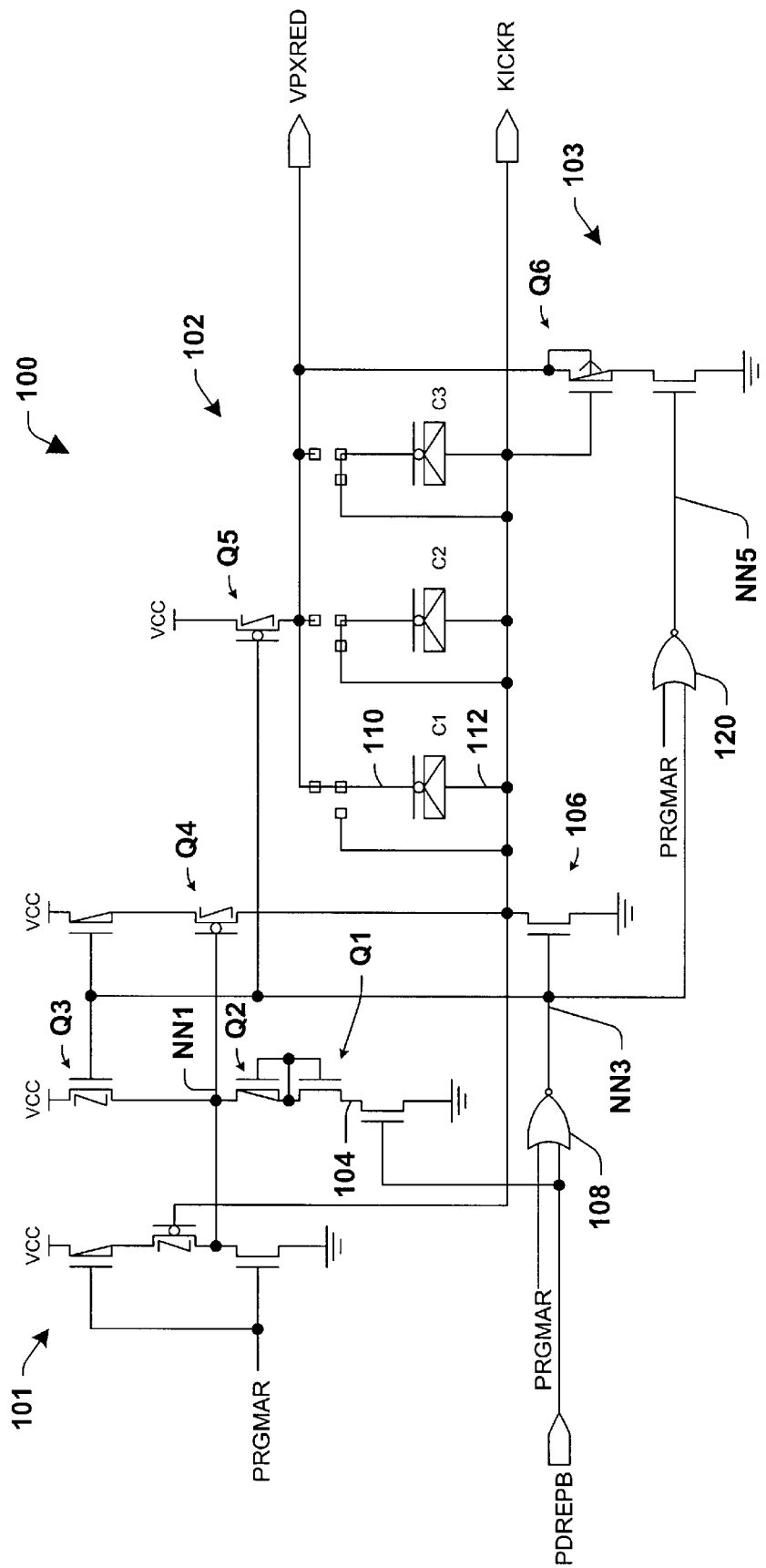
FIG. 3 is a schematic illustration of an exemplary voltage booster for providing a boosted CAM cell gate voltage in accordance with the invention.

Turning now to FIG. 3, an exemplary voltage booster 100 is illustrated for providing a boosted CAM cell gate voltage VXPRED during a CAM cell read operation in accordance with the invention. The boosted voltage VXPRED is established by the boost circuit 100 substantially independent of voltage swings in the memory device supply voltage VCC, whereby proper.CAM cell read operation is ensured in the presence of such swings. In addition, the boosted gate voltage VXPRED is clamped to prevent variance associated therewith, as illustrated and described in greater detail below. The booster 100 may thus be advantageously employed in reading CAM cells in low power memory devices, and/or in reading dual bit type CAM cells having erased and programmed cell threshold voltages of approximately 2.0 and 3.5 volts, respectively.

The booster 100 may be connected between the gate terminal of a CAM cell (e.g., CAM cell 4 of FIG. 1) and a supply voltage VCC to provide the boosted voltage VXPRED to the gate terminal of the CAM cell during a CAM read operation, wherein the boosted voltage VXPRED is greater than the erased CAM cell threshold voltage and less than the programmed CAM cell threshold voltage. Thus, where employed in association with a dual bit CAM cell, the boosted voltage VXPRED may be provided between approximately 2.0 and 3.5 volts in order to ensure proper reading of the CAM contents.

As illustrated in FIG. 3, the exemplary voltage booster 100 comprises a first circuit 101 providing a first voltage KICKR which is substantially independent of the supply voltage VCC, and a second circuit 102 receiving the first voltage KICKR, which provides the boosted and clamped CAM read gate voltage VXPRED, wherein VXPRED is greater than the first voltage KICKR. The clamping of the voltage VXPRED is provided via a third circuit 103 clamping VXPRED to the boosted voltage required by the CAM cell.

The first circuit 101 comprises first and second diode connected transistors Q1 and Q2, respectively, wherein Q1 is an NMOS device and Q2 is a PMOS device. Transistors Q1 and Q2 are connected in series between a first node 104 electrically connected to ground according to a control signal PDREPB, which is held high during a CAM read operation, and a second node NN1. The first circuit 101 further comprises a third transistor Q3 connected between the second node NN1 and VCC, wherein the transistor Q3 is a Z type device having a threshold voltage near zero (sometimes referred to as zero threshold devices). A fourth (e.g., Z type) transistor Q4 is connected in the first circuit 101 between the second node NN1 and the second circuit 102 to provide the first voltage KICKR.

During a CAM read operation, the control signal PRGMAR is held low, whereby an N type transistor 106 is off via the NOR gate 108. As a result, the first voltage KICKR is approximately equal to the sum of threshold voltages associated with the first and second transistors Q1 and Q2 (e.g., VTn+VTp) minus a threshold voltage (e.g., VTz) associated with the fourth transistor Q4. It will be noted at this point, that the first voltage KICKR (e.g., approximately equal to VTn+VTp−VTz) is established by the first circuit 101 largely independent of swings in the supply voltage VCC (e.g., ranging typically between 2.7 and 3.6 volts) in most low power applications.

The second circuit 102 comprises one or more capacitors C1, C2, and/or C3, as well as a fifth transistor Q5 operatively connected between a first terminal 110 of the capacitor C1 and the supply voltage to charge the capacitor C1 (e.g., and/or C2 and C3) to a voltage approximately equal to the supply voltage VCC prior to the CAM read operation. Thus, prior to the CAM read operation, the signal PDREPB may be brought low, whereby the gate 108 turns transistor 106 on allowing capacitors C1, C2, and/or C3 to be charged to approximately the supply voltage VCC via the fifth transistor Q5, wherein Q5 is a Z type transistor. During a CAM read operation, node NN3 goes low and the second circuit 102 receives the first voltage KICKR from the first circuit 101 at a second terminal 112 of the capacitor C1 and provides the second (e.g., boosted and clamped) voltage VXPRED at the first terminal 110 of the capacitor C1. In this fashion the second voltage VXPRED is greater than the first voltage KICKR, due to the charged capacitor C1 (e.g., and/or C2 and C3).

In order to clamp the voltage VXPRED, the third circuit 103 comprises a sixth transistor Q6, a PMOS transistor, operatively connected between the first and second terminals 110 and 112, respectively, (via its source and gate terminals) of the capacitor C1, thereby clamping the voltage across the capacitor C1 to a threshold voltage (e.g., VTp) associated with Q6 during the CAM read operation. The device Q6 is turned on during the CAM read via a high signal on a node NN5 from a NOR gate 120 as a result of signal PRGMAR being brought low. In this manner, the second voltage VXPRED is clamped at the boosted voltage required to properly read the CAM cell. The boosted and clamped voltage VXPRED is thus approximately equal to the sum of the threshold voltages associated with the first, second, and sixth transistors Q1, Q2, and Q6, respectively (e.g., VTn+2|VTp|) minus the threshold voltage VTz associated with the fourth transistor Q4, whereby the boosted voltage VPXRED (e.g., VTn+2|VTp|−VTz) is substantially independent of variations in the supply voltage. In this regard, the exemplary voltage booster 100 provides a voltage VXPRED between approximately 2.0 and 3.5 volts.

Figure 4:
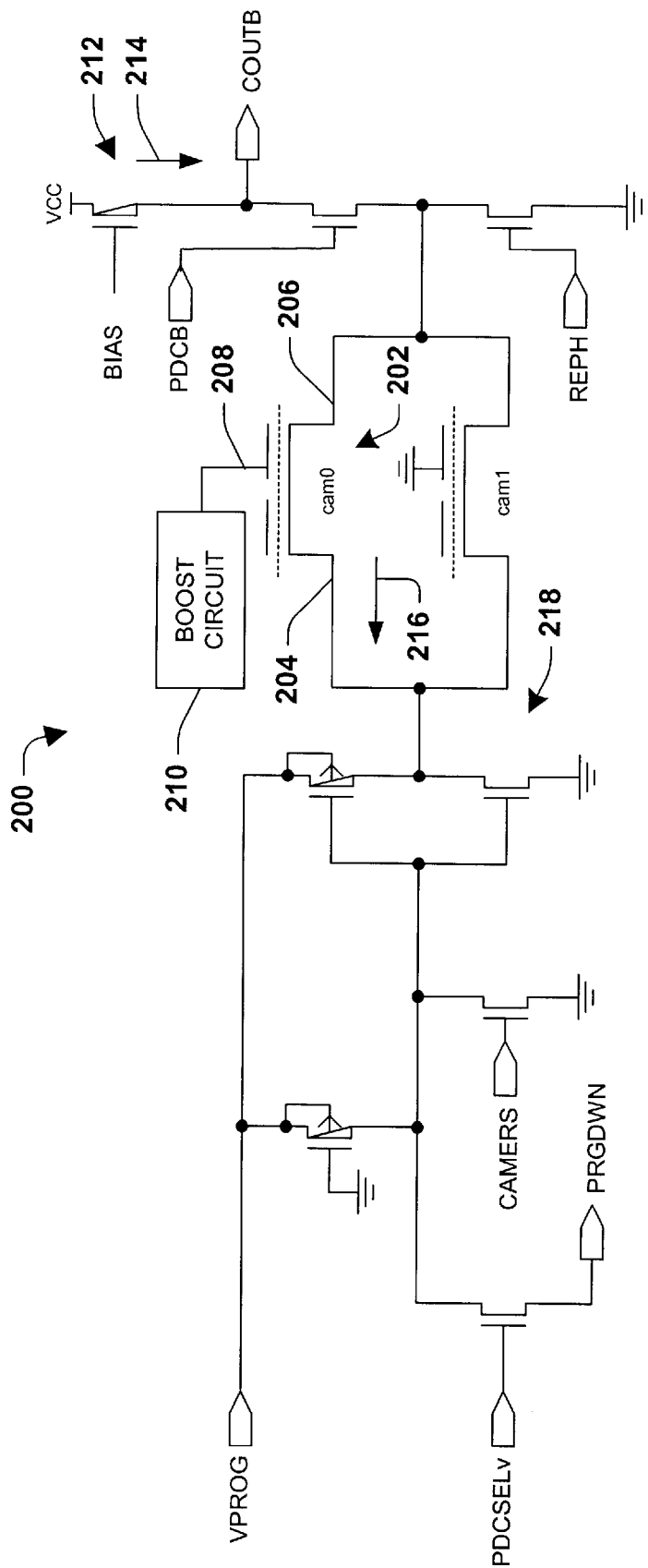
FIG. 4 is a schematic illustration of an exemplary CAM cell and associated circuitry in which the invention may be carried out.

Another exemplary CAM cell circuit 200 is illustrated in FIG. 4, in which a CAM cell 202 comprising a source 204, a drain 206 and a gate 208 is operatively connected to a voltage booster 210, which provides a boosted gate voltage to the CAM cell 202 during a CAM read operation. The CAM circuit 200 further comprises a PMOS load transistor 212 biased by a gate voltage BIAS, through which a load current 214 flows during a CAM read. Using the ratio read technique described above with respect to FIG. 2, the relative strength of the CAM cell 202 and the PMOS load transistor 212 are determined, whereby a large CAM cell current 216 flows when the CAM cell 202 is erased (e.g., CAM data=1), and a smaller current 216 (e.g., a leakage current) flows when the CAM cell 202 is programmed (e.g., CAM data=0). Thus, when the CAM cell 202 is erased, the CAM cell lowers the voltage at node COUTB closer to ground, via transistor 218 (e.g., wherein transistor 218 is on during a CAM read operation via a high PDCSELv signal). When the CAM cell 202 is programmed, the CAM cell 202 is not strong enough to overcome the load transistor 212, whereby the voltage at node COUTB is brought close to the supply voltage VCC.

As with the exemplary booster circuits 20, 74, and 100 of FIGS. 1, 2, and 3, respectively, the booster 210 provides a boosted voltage to the gate terminal 208 of the CAM cell 202 during the CAM read operation, wherein the boosted voltage is greater than the erased CAM threshold voltage and less than the programmed CAM threshold voltage. As illustrated and described above, the boosted CAM gate voltage is derived generally independently of the supply voltage VCC, and may be clamped, whereby the voltage at the CAM cell gate terminal 208 is in an appropriate range for proper CAM cell reading, for example, between approximately 2.0 and 3.5 volts for a dual bit CAM cell 202. Note that in FIG. 4, the boost circuit 210 can be selectively switched among a plurality of CAM cells (e.g., cam0 and cam1), as may be desired.

Figure 5:
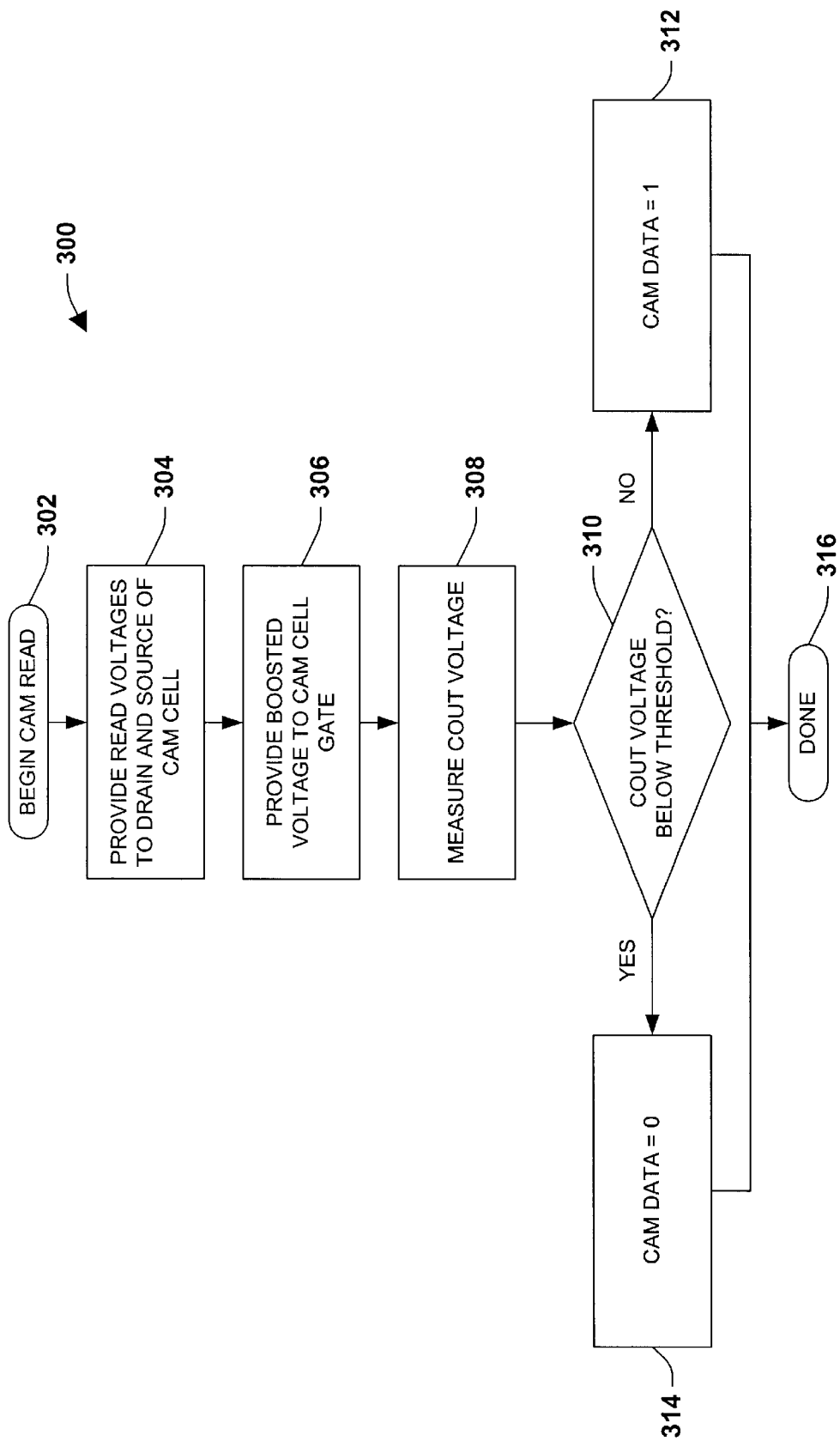
FIG. 5 is a flow diagram illustrating an exemplary method for reading a CAM cell in a memory device in accordance with another aspect of the invention.

Another aspect of the present invention provides methodologies for reading a CAM cell associated with a memory device, which may be advantageously employed to read signal bit and/or dual bit CAM cells. An exemplary method 300 is illustrated in FIG. 5 in accordance with the invention. While the exemplary method 300 is illustrated and described herein as a series of acts or events, it will be appreciated that the present invention is not limited by the illustrated ordering of such acts or events, as some acts may occur in different orders and/or concurrently with other acts or events apart from those illustrated and/or described herein, in accordance with the invention. In addition, not all illustrated steps may be required to implement a methodology in accordance with the present invention. Moreover, it will be appreciated that the method 300 may be implemented in association with the apparatus and systems illustrated and described herein as well as in association with other systems not illustrated.

Beginning at 302, the method 300 comprises providing a drain read voltage to a drain terminal of the CAM cell (e.g., drain 62 of CAM cell 50 in FIG. 2) and providing a source voltage to a source terminal (e.g., terminal 60) thereof at 304. At 306, a boosted voltage is applied to a gate terminal of the CAM cell (e.g., via the exemplary voltage booster 100 of FIG. 3), and a voltage COUT is measured at 308. For instance, the measurement of COUT at 308 may be employed in association with the ratio method described above, whereby an indication of the CAM cell current is obtained in order to determine whether CAM cell is programmed or erased. The providing of a boosted voltage at step 306 further comprises providing a boosted voltage which is substantially independent of the supply voltage. Further, such a boosted voltage may be clamped or otherwise regulated (e.g., as discussed in conjunction with circuit 103 of FIG. 3) to ensure that the boosted voltage supplied to the CAM cell gate is between a programmed CAM cell threshold voltage and an erased CAM cell threshold voltage, respectively, thereby ensuring an accurate read of the CAM cell data.

Thereafter at 310, a determination is made as to whether the COUT voltage is above or below a threshold value. If above (e.g., no at 310), the CAM data is identified at 312 to be 1 (e.g., cell is erased), and if below (e.g., yes at 310), the CAM cell data is determined at 314 to be 0 (cell is programmed), whereafter the method 300 ends at 316.

Those skilled in the art will recognize that the aspects and implementations described above and illustrated in the attached drawings are intended for purposes of illustration only and that the subject invention may be implemented in various ways. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

Although the invention has been shown and described with respect to one or more implementations, equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention.

In addition, while a particular feature of the invention may have been disclosed with respect to only one of several implementations, such feature may be combined with one or more other features of the other implementations as may be desired and advantageous for any given or particular application. Furthermore, to the extent that the term "includes" is used in either the detailed description and the claims, such term is intended to be inclusive in a manner similar to the term "comprising."

What is claimed is:

1. A memory device having a plurality of memory cells adapted to store data, comprising:
   a CAM cell operative to indicate a binary value associated with a condition in the memory device during a CAM cell read operation when a voltage between an erased CAM cell threshold voltage and a programmed CAM cell threshold voltage is applied to a gate terminal of the CAM cell; and
   a voltage booster operatively coupled between the gate terminal of the CAM cell and a supply voltage and operative to provide a boosted voltage to the gate terminal of the CAM cell during the CAM cell read operation, wherein the boosted voltage is greater than the erased CAM cell threshold voltage and less than the programmed CAM cell threshold voltage, and wherein the boosted voltage is substantially independent of the supply voltage.

2. The memory device of claim 1, wherein the boosted voltage is between approximately 2.0 and 3.5 volts.

3. The memory device of claim 1, wherein the voltage booster comprises:
   a first circuit providing a first voltage which is substantially independent of the supply voltage;
   a second circuit receiving the first voltage from the first circuit and providing a second voltage which is greater than the first voltage and a function of the first voltage; and
   a third circuit clamping the second voltage to the boosted voltage;
   whereby the boosted voltage is substantially independent of variations in the supply voltage.

4. The memory device of claim 3, wherein the first circuit comprises:
   first and second diode connected transistors serially connected between a first node electrically connected to a ground reference and a second node;
   a third transistor connected between the second node and the supply voltage; and
   a fourth transistor connected between the second node and the second circuit.

5. The memory device of claim 4, wherein the first and second transistors are NMOS and PMOS transistors, respectively, and wherein the third and fourth transistors are Z type MOS transistors, and wherein the first voltage is approximately equal to a sum of threshold voltages associated with the first and second transistors minus a threshold voltage associated with the fourth transistor.

6. The memory device of claim 4, wherein the second circuit comprises a capacitor and a fifth transistor operatively connected between a first terminal of the capacitor and the supply voltage to charge the capacitor to a voltage approximately equal to the supply voltage prior to the CAM read operation.

7. The memory device of claim 6, wherein the second circuit receives the first voltage from the first circuit at a second terminal of the capacitor and provides the second voltage at the first terminal of the capacitor, whereby the second voltage is greater than the first voltage and a function of the first voltage.

8. The memory device of claim 6, wherein the third circuit comprises a sixth transistor operatively coupled between the first and second terminals of the capacitor so as to clamp the voltage across the capacitor to a threshold voltage associated with the sixth transistor during the CAM read operation, whereby the second voltage is clamped at the boosted voltage.

9. The memory device of claim 8, wherein the boosted voltage is approximately equal to the sum of the threshold voltages associated with the first, second, and sixth transistors minus the threshold voltage associated with the fourth transistor, whereby the boosted voltage is substantially independent of variations in the supply voltage.

10. The memory device of claim 9, wherein the boosted voltage is between approximately 2.0 and 3.5 volts.

11. The memory device of claim 3, wherein the second circuit comprises a capacitor and a fifth transistor operatively connected between a first terminal of the capacitor and the supply voltage to charge the capacitor to a voltage approximately equal to the supply voltage prior to the CAM read operation.

12. The memory device of claim 11, wherein the second circuit receives the first voltage from the first circuit at a second terminal of the capacitor and provides the second voltage at the first terminal of the capacitor, whereby the second voltage is greater than the first voltage and a function of the first voltage.

13. The memory device of claim 3, wherein the third circuit comprises a sixth transistor operatively connected between the first and second terminals of the capacitor so as to clamp the voltage across the capacitor to a threshold voltage associated with the sixth transistor during the CAM read operation, whereby the second voltage is clamped at the boosted voltage.

14. The memory device of claim 13, wherein the boosted voltage is approximately equal to the sum of the threshold voltages associated with the first, second, and sixth transistors minus the threshold voltage associated with the fourth transistor, whereby the boosted voltage is substantially independent of variations in the supply voltage.

15. A CAM read circuit in a memory device having a plurality of memory cells adapted to store data and a CAM cell operative to indicate a binary value associated with a condition in the memory device during a CAM cell read operation when a voltage between an erased CAM cell threshold voltage and a programmed CAM cell threshold voltage is applied to a gate terminal of the CAM cell, the CAM read circuit comprising:

a voltage booster operatively coupled between the gate terminal of the CAM cell and a supply voltage and operative to provide a boosted voltage to the gate terminal of the CAM cell during the CAM cell read operation, wherein the boosted voltage is greater than the erased CAM cell threshold voltage and less than the programmed CAM cell threshold voltage, and wherein the boosted voltage is substantially independent of the supply voltage.

16. The CAM read circuit of claim 15, wherein the voltage booster comprises:

a first circuit providing a first voltage which is substantially independent of the supply voltage;

a second circuit receiving the first voltage from the first circuit and providing a second voltage which is greater than the first voltage and a function of the first voltage; and a third circuit clamping the second voltage to the boosted voltage;

whereby the boosted voltage is substantially independent of variations in the supply voltage.

17. The CAM read circuit of claim 16, wherein the first circuit comprises:

first and second diode connected transistors serially connected between a first node electrically connected to a ground reference and a second node;

a third transistor connected between the second node and the supply voltage; and a fourth transistor connected between the second node and the second circuit;

wherein the first voltage is the sum of threshold voltages associated with the first, second, and fourth transistors.

18. The CAM read circuit of claim 17, wherein the second circuit comprises a capacitor and a fifth transistor operatively connected between a first terminal of the capacitor and the supply voltage to charge the capacitor to a voltage approximately equal to the supply voltage prior to the CAM read operation, and wherein the second circuit receives the first voltage from the first circuit at a second terminal of the capacitor and provides the second voltage at the first terminal of the capacitor, whereby the second voltage is greater than the first voltage and a function of the first voltage.

19. The CAM read circuit of claim 18, wherein the third circuit comprises a sixth transistor operatively connected between the first and second terminals of the capacitor so as to clamp the voltage across the capacitor to a threshold voltage associated with the sixth transistor during the CAM read operation, whereby the second voltage is clamped at the boosted voltage, and wherein the boosted voltage is approximately equal to the sum of the threshold voltages associated with the first, second, and sixth transistors minus the threshold voltage associated with the fourth transistor, whereby the boosted voltage is independent of variations in the supply voltage.

20. A method of reading a CAM cell associated with a memory device, comprising:

providing a drain read voltage to a drain terminal of the CAM cell;

providing a source voltage to a source terminal of the CAM cell;

providing a boosted voltage to a gate terminal of the CAM cell, wherein the boosted voltage is substantially independent of a memory device supply voltage; and measuring a current associated with the CAM cell in order to determine the data stored in the CAM cell.

* * * * *

UNITED STATES PATENT AND TRADEMARK OFFICE
CERTIFICATE OF CORRECTION

PATENT NO.   : 6,381,163 B1
DATED        : April 30, 2002
INVENTOR(S)  : Kazuhiro Kurihara and Shane Hollmer It is certified that error appears in the above-identified patent and that said Letters Patent is hereby corrected as shown below:

<u>Column 8,</u>
Line 29, please replace the word "modem" with the word -- modern --.

Signed and Sealed this

Twenty-fifth Day of June, 2002

*Attest:*

*Attesting Officer*

JAMES E. ROGAN
*Director of the United States Patent and Trademark Office*